(12) United States Patent
Lara et al.

(10) Patent No.: US 6,745,145 B2
(45) Date of Patent: Jun. 1, 2004

(54) METHODS AND SYSTEMS FOR ENHANCED AUTOMATED SYSTEM TESTING

(75) Inventors: John M. Lara, Wichita, KS (US); Robin Huber, Wichita, KS (US)

(73) Assignee: LSI Logic Corporation, Milpitas, CA (US)

(*) Notice: Subject to any disclaimer, the term of this patent is extended or adjusted under 35 U.S.C. 154(b) by 57 days.

(21) Appl. No.: 10/178,135

(22) Filed: Jun. 24, 2002

(65) Prior Publication Data

US 2003/0236644 A1 Dec. 25, 2003

(51) Int. Cl.⁷ .............................................. G01M 19/00
(52) U.S. Cl. ...................................................... 702/121
(58) Field of Search .................... 702/64, 65, 117–123; 324/73.1, 500, 537, 763; 714/724, 725

(56) References Cited

U.S. PATENT DOCUMENTS

| | | | |
|---|---|---|---|
| 4,474,186 A | 10/1984 | Ledley et al. | |
| 4,578,665 A | 3/1986 | Yang | |
| 4,807,161 A | 2/1989 | Comfort et al. | |
| 6,141,719 A | * 10/2000 | Rafferty et al. | 710/316 |
| 6,530,054 B2 | 3/2003 | Hollander | |
| 6,536,006 B1 | * 3/2003 | Sugamori | 714/724 |
| 6,622,272 B1 | * 9/2003 | Haverkamp et al. | 714/725 |
| 2003/0043757 A1 | * 3/2003 | White | 370/254 |

* cited by examiner

Primary Examiner—Michael Nghiem
(74) Attorney, Agent, or Firm—Lathrop & Gage, L.C.

(57) ABSTRACT

Electrical components and associated processes for enhancing automated test of a system by permitting automated generation and application (injection) of real-world stimuli applied to the system under test without the need for manual intervention. Electrical components of the present invention intercede in the exchange of signals and power over various signaling paths within a system under test. Under programmable control by methods of the invention, the electrical components of the present invention may simulate any desired real-world stimulus on any signal path associated with the system under test. Automated test procedures associated with the electrical components may then automate all phases of a test procedure including setup of the test environment, application of real-world stimuli, verification of operation of the system under test and cleanup and recovery following performance of the automated test sequence.

18 Claims, 2 Drawing Sheets

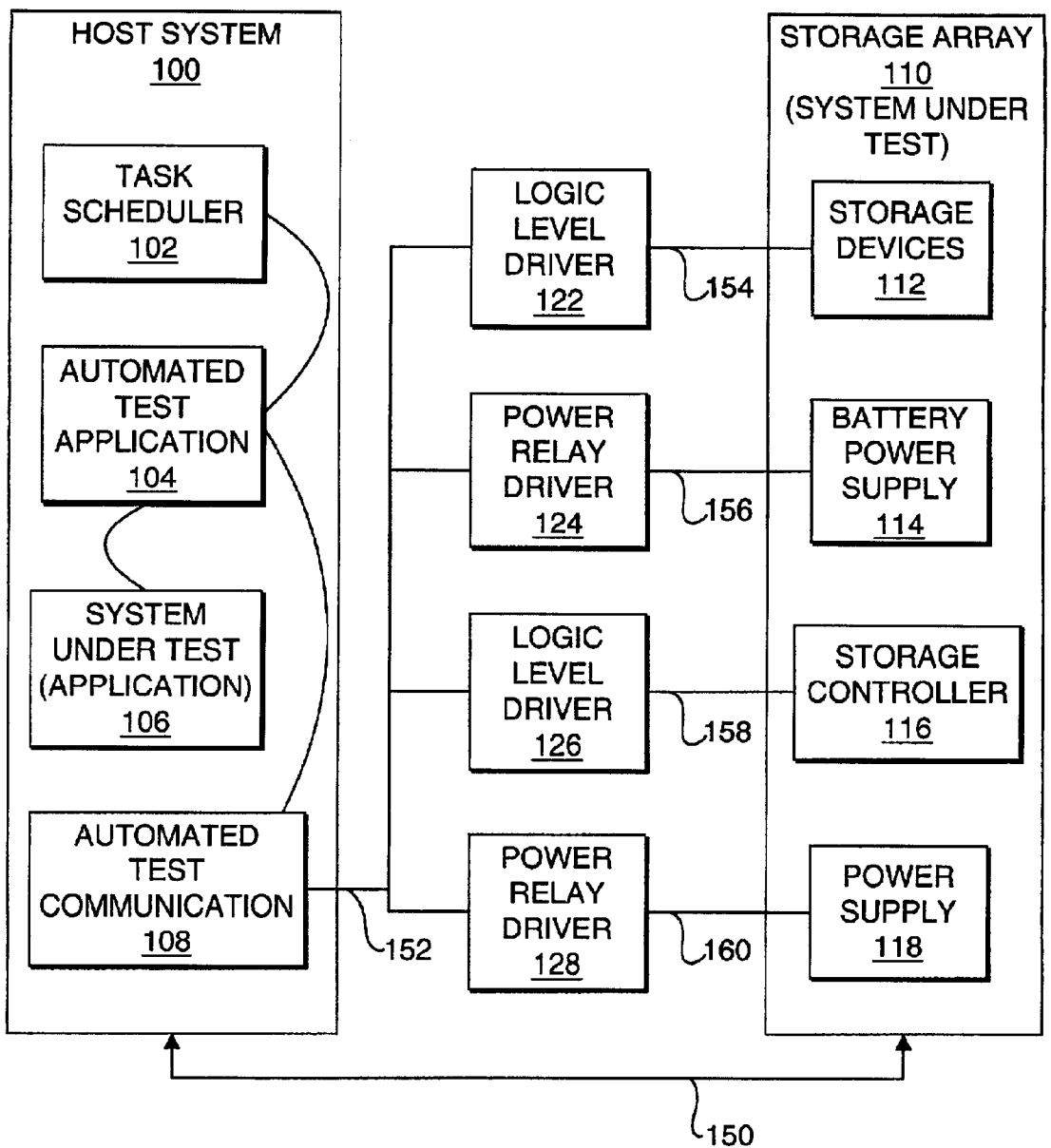
FIG._1

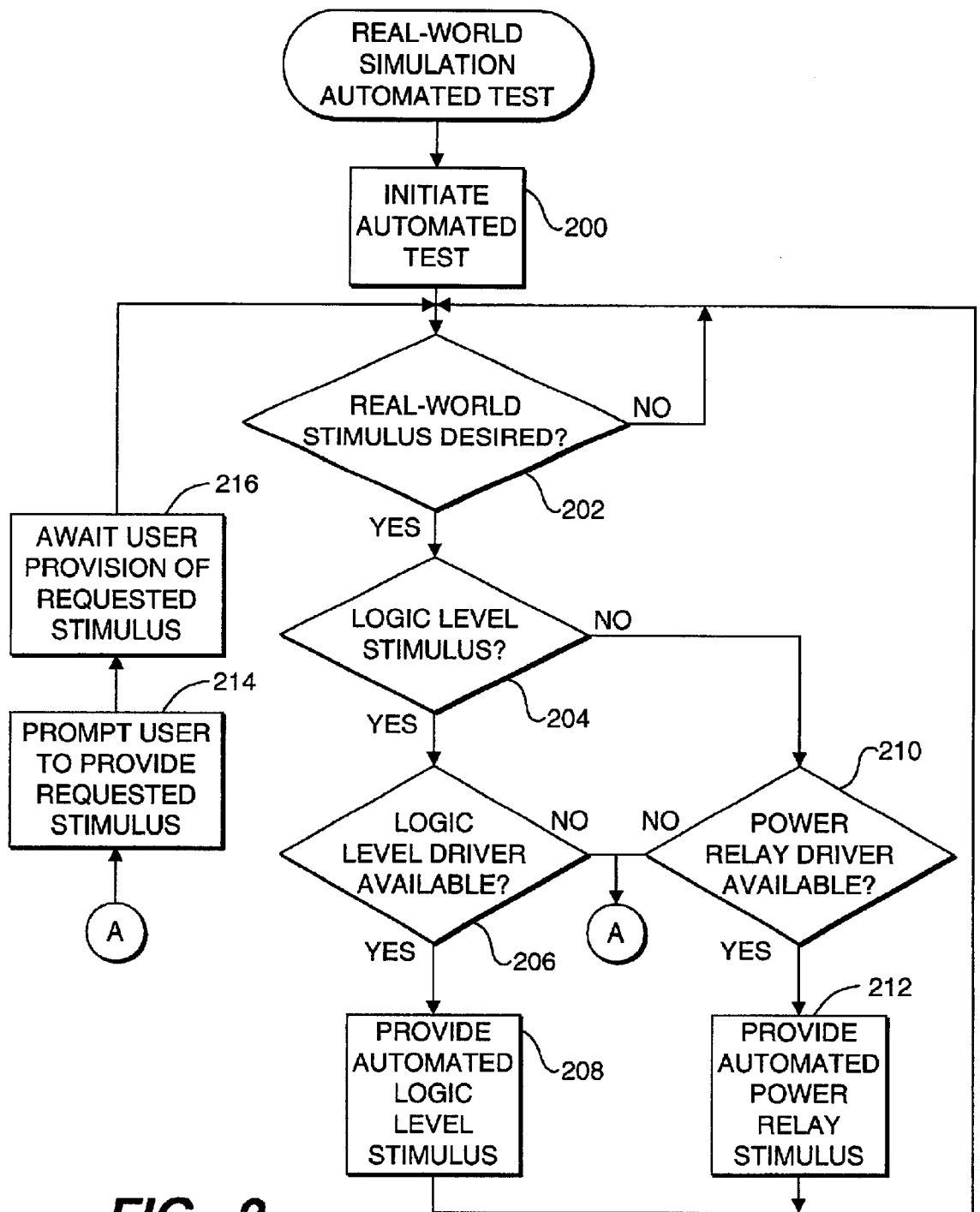
FIG._2

METHODS AND SYSTEMS FOR ENHANCED AUTOMATED SYSTEM TESTING

BACKGROUND OF THE INVENTION

1. Field of the Invention

The invention generally relates to automated testing systems and more specifically relates to circuit structures and systems for improved automated testing of electrical interfaces in systems under test.

2. Discussion of Related Art

In electronic systems it is common for components within a system to be interconnected via electronic signal buses. Signals are exchanged among the various components of a system through such electronic buses. For example, in a computer storage subsystem, a storage controller within the storage subsystem may be coupled to host computers via an I/O interface bus and may be coupled to other components within the storage subsystem via internal electronic signal buses. Further, components within such a storage subsystem may be coupled to power supply signal paths to receive electrical power during normal operation.

When testing such systems in a manufacturing environment it is important to test the various interface bus connections and power supply connections to verify proper operation of the subsystem in response to various common operating environments and common failure modes. For example, if the operation of a subsystem is specified to behave in a certain respect in response to changes in power status or loss of power, it is important to simulate such a loss of power and verify the proper operation of a system. For example, it may be important to verify proper operation of the subsystem in response to sensing connection and disconnection of various components within the subsystem. Still more specifically, with regard to a storage subsystem, it may be important to verify operation of the system in response to power failure, removal or insertion of disk drive storage units, host interface bus failures, and other common failure modes of a storage subsystem.

It is also generally known in the art to automate the process of testing manufactured devices by applying external stimuli to the subsystem and verifying proper response of the subsystem in response to the various stimuli. Such automated test systems generally use a computer system programmed with an automated test sequence application. The automated test application follows a sequence of commands to perform certain desired tests on the system under test. The commands may be provided to the test application as, for example, scripts of commands to be interpreted by the test application. The commands instruct the test application to generate sequences of test data for testing normal operation of the system under test. The test application then cooperates with other elements in the host system to communicate the desired test data to the system under test and verifies proper operation of the system under test in response to the generated test data.

In addition to testing proper operation of the subsystem in response to programmable sequences of test data, failure modes as noted above often involve changes to the "real-world" environment in which the system under test is functioning. Simulating such failure modes typically requires manual intervention in the testing process. For example, to verify proper operation of a system under test in response to loss of power, manual intervention is typically required to remove power supplied to the system under test. The test application then verifies proper operation of the system under test in response to the manually generated stimulus. Or, for example, in the case of automated testing of a storage subsystem, manual intervention may be required to remove or insert a disk drive to verify operation of the subsystem in response thereto.

It is generally a problem to require manual intervention in a testing process. Manual intervention introduces a probability of human error in the automated testing process and also slows the automated testing process when manual intervention is required. It is therefore evident from the above discussion that a need exists for improved automated testing procedures and systems to reduce or eliminate reliance on manual intervention for testing operation of a system in response to "real-world" stimuli.

SUMMARY OF THE INVENTION

The present intervention solves the above and other problems, thereby advancing the state of the useful arts, by providing enhanced systems and methods to automate simulation of "real-world" environmental conditions and to verify response of the system under test in response to such real-world stimuli. In general, the present invention provides electrical components (also referred to herein as switching devices) designed to intervene in the normal exchange of signals and power over interface buses and power signal buses within a system under test. These switching devices are coupled through a standard communications interface to the automated testing subsystem operable to perform automated testing on the system under test. The automated testing system is then adapted to command the electrical components to simulate real-world conditions without the need for human intervention. The automated test system may thereby generate real-world stimuli automatically and verify proper operation of the system under test in response thereto.

These enhanced systems and processes of the present invention serve to centralize control of real-world interfaces to be driven by a single test application. Through the communications interface with the enhanced components, a common software interface may be used by the automated test application to control all real-world interfaces in the automated test sequence. This test architecture therefore allows an automated test application to control all phases of a test sequence including setup of the test environment, verification of the system operation and recovery or cleanup of environmental conditions following the test sequence—all without requiring manual intervention. Eliminating the need for manual intervention also enables continuous (i.e., 24×7) test operation to thereby improve productivity of a test function. Furthermore, this enhanced automated test architecture is easily expandable to utilize new, previously unknown real-world interfaces by providing other variants of switching device to intercept and inject signals associated with the interfaces.

A feature of the invention therefore provides an apparatus for enhanced automated testing of a system under test, the apparatus comprising: an automated test system for applying stimuli to the system under test and for verifying proper operation of the system under test in response to the stimuli; a switching device for controllably applying stimuli to the system under test; and a communication medium coupling the automated test system to the switching device to enable control of the switching device by the automated test system.

Another aspect of the invention further provides that the switching device comprises: a logic level switching device to switch logic signals within the system under test as the stimuli thereto.

Another aspect of the invention further provides that the switching device comprises: a power relay switching device to switch power signals within the system under test as the stimuli thereto.

Another aspect of the invention further provides that the communication medium is a serial interface.

Another aspect of the invention further provides that the communication medium is a network communication medium.

Another aspect of the invention further provides that the system under test is a storage subsystem including a storage controller, a storage device and an interface bus and such that the switching device comprises: a logic level drive device coupled to the interface bus between the storage controller and the storage device to simulate signals exchanged there between via the interface bus.

Another aspect of the invention further provides that the logic level drive device further comprises: a storage device present signal path to simulate removal and insertion of the storage unit.

Another aspect of the invention further provides that the system under test is a storage subsystem including a storage controller, a power supply device and a power bus and such that the switching device comprises: a power relay drive device coupled to the interface bus between the storage controller and the storage device to simulate power signals exchanged there between via the power bus.

Another aspect of the invention further provides that the power relay drive device further comprises: a power signal path to simulate removal and application of power signals from the power supply device to the storage controller.

Another aspect of the invention further provides that the power supply device is a battery power supply device.

Another feature of the invention provides a method for testing a system under test comprising the steps of: detecting a need for a real-world stimulus to be applied to the system under test; and providing the real-world stimulus without manual intervention.

Another aspect of the invention further provides that the step of detecting includes the step of: interpreting a test command requesting generation and application of the real-world stimulus.

Another aspect of the invention further provides that the step of providing includes the steps of: generating the real-world stimulus without manual intervention; and applying the real-world stimulus to the system under test without manual intervention.

Another aspect of the invention further provides that the step of providing includes the step of: controlling a driver element to controllably generate the real-world stimulus and to controllably apply the generated real-world stimulus to the system under test.

Another aspect of the invention further provides that the step of controlling includes the steps of: determining a signal type associated with the real-world stimulus such that the driver element corresponds to the signal type.

Another aspect of the invention further provides that the signal type is a logic signal and such that the driver element is a logic level driver element.

Another aspect of the invention further provides that the signal type is a power signal and such that the driver element is a power relay driver element.

Another feature of the invention provides an apparatus for enabling automated testing of a system under test by a test system, the apparatus comprising: a signal driver element including: means for coupling the driver element to a signal path of the system under test; communication means for communicating between the signal driver element and the test system; and signal means for controllably intercepting and injecting signals on the signal path in response to requests received from the test system via the communication means.

Another aspect of the invention further provides that the signal path is a logic signal path and such that the signal means controllably intercepts and injects logic signals on the signal path.

Another aspect of the invention further provides that the signal path is a power signal path and such that the signal means controllably intercepts and injects power signals on the signal path.

BRIEF DESCRIPTION OF THE DRAWINGS

FIG. 1 is a block diagram depicting enhanced automated test features integrated with a system under test in accordance with the present invention.

FIG. 2 is a flowchart describing a method of operation for an automated test system utilizing the enhanced features a FIG. 1

DETAILED DESCRIPTION OF THE PREFERRED EMBODIMENTS

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

FIG. 1 is a block diagram depicting switching elements integrated with the automated test features of a system for improved automated testing of a system under test 110. System under test 110 may be any type of system that benefits from an automated test capability. Key to such a system is a plurality of components within the system interconnected by electrical signaling paths or buses including, for example, logic signal buses and power distribution buses. As shown in FIG. 1, system under test 110 may be, for example, a storage array subsystem including one or more storage devices 112 electronically coupled to a storage controller 116. Power supply 118 and an optional battery backup power supply 114 both supply electrical power to storage devices 112 and to storage controller 116 via appropriate power distribution buses within the storage array subsystem 110 (system under test).

A host computing system 100 and is preferably coupled to system under test 110 via communication path 150. A software component 106 within host system 100 provides standard application-specific interaction with the system under test 110. For example, where system under test 110 is a storage array subsystem, system under test application 106 within host system 100 provides standard storage management features for storage and retrieval of information to and from the storage array subsystem.

In a test environment operable within host system 100, automated test application 104 coordinates sequences of operations to be performed to verify proper operation of the system under test 110. Frequently, automated test application 104 is operable to interpret scripts of commands indicating particular sequences of operations to be performed and verified to fully test proper operation of system under test 110. Those of ordinary skill in the art will recognize a variety of programming styles and paradigms that may be used to construct an automated test application 104. Interpretive script processing is therefore intended merely as exemplary of one such of well known automated test application design.

Automated test application 104 may interact with a scheduler component 102 and system under test application 106 to coordinate timing of the desired sequences of commands and to verify proper operation of the system under test 110. In general, automated test application 104 generates a number of stimuli to be applied to the system under test and then verifies proper operation of the system under test in response to application of each such stimulus. As is well known in the art, such stimuli may include sequences of commands, data and status information to be exchanged between host system 100 and system under test 110 via communication path 150.

In addition, as noted above, it is critical in thorough testing of a system under test of that real-world stimuli be applied to the system under test to verify proper operation in response to such real-world environmental stimuli. Examples of such real-world environmental stimuli include removal or application of power signals associated components of the system under test and generation or modification of logic level signals associated with components of the system under test. As noted above, as presently practiced in the art, such real-world environmental stimuli generally require manual intervention by a human operator. Such human intervention introduces opportunities for errors in the testing procedure and dramatically slows the test process by requiring the otherwise automated test procedure to wait for human interaction to proceed further on a test.

In accordance with the present invention, signal switching elements 122 through 128 are coupled to bus structures 154 through 160 of system under test 110 to permit interception, generation and injection of signals within system under test 110 via automated testing processes operable within host system 100. Switching devices 122 through 128, under control of host system 100, therefore enable automated test processing to include generation of real-world environmental stimuli and application of such stimuli to the system under test without the need for manual intervention. More specifically, switching devices 122 through 128 are coupled to internal bus structures 154 through 160 of system under test 110 to intercept, generate and inject signals to be exchanged between the various components 112 through 118 of system under test 110. Still more specifically, where system under test 110 is, for example, a storage array subsystem, switching devices 122 through 128 may intercept, generate and inject signals exchanged between storage controller 116 and storage devices 112 as well as power supply signals exchanged between power supply 114 or 118 and storage controller 116 and storage devices 112.

In a preferred embodiment, switching devices 122 through 128 comprise at least two different forms of switching elements. A first type of switching device preferably uses standard integrated circuitry and/or discrete electronic components to intercept, generate and inject logic level signals on buses interconnecting components of the system under test (or on buses connecting the system under test with a host system). For example, logic level drivers 122 and 126 are coupled via bus 154 and 158, respectively, to storage devices 112 and storage controller 116, respectively. These logic level drivers 122 and 126 are capable of intercepting, generating and injecting logic level signals to simulate desired stimuli in signals exchanged between, for example, storage controller 116 and storage devices 112.

A second type of switching device in one preferred embodiment uses power relay switching devices to intercept, generate and inject power signals to be applied to devices within system under test 110. For example, as shown in FIG. 1, power relay driver 124 may intercept, generate or inject signals via bus 156 to generate stimuli associated with battery power supply 114. In like manner power relay driver 128 may intercept, generate and inject power signals associated with power supply 118 via bus 160.

Switching devices 122 through 128 are preferably coupled via communication path 152 to automated test communication element 108 within host system 100. Automated test application 104 within host system 100 preferably communicates with switching devices 122 through 128 in cooperation with automated test communication element 108. Signals exchanged with switching devices 122 through 128 via path 152 instruct the switching devices regarding the nature and timing of desired stimuli for simulation of changes in real-world environmental aspects of operation of the system under test 110.

Switching devices 122 through 128 and associated software control elements operable within host system 100 therefore provide full automation for testing of system under test 110 including the automatic generation of real-world environmental stimuli and verification of operation in response thereto. These features permit fully automated testing of the system under test obviating the need for manual intervention in the performance of particular tests. As noted above, this allows for more accurate test procedures by reducing possibility of human error and also enables nonstop testing procedures devoid of the need for human intervention.

Those of ordinary skill in the art will recognize a variety of equivalent configurations and topologies for the components depicted in FIG. 1. In particular, those of ordinary skill in the art will readily recognize that system under test 110 may be any electronic subsystem having at least one component exchanging logic level signals and/or power signals with another component—typically via a bus structure. The storage array subsystem as shown in FIG. 1 is therefore intended merely as exemplary of a number of such systems. Further, those of ordinary skill in the art will readily recognize that switching elements 122 through 128 are preferably physically positioned and electronically coupled in such a manner as to intercept signals on such buses associated with the system under test. Various forms of cabling and connector techniques well known to those of ordinary skill in the art allow for such a device to be inserted within a signal exchange path of the system under test. Further, those of ordinary skill in the art will clearly recognize that the particular components shown within host system 100 are merely intended as suggestive of one possible functional decomposition of operating components within the host system. Numerous other functional representations will be apparent to those of ordinary skill in the art. Still further, those of ordinary skill in the art will recognize that bus structures 154 through 160 represent any of several well known bus structures commercially available or may represent customized, application-specific bus structures unique to the particular environment. Switching devices 154 through 160 require only that they be positioned physically and electrically to allow interception, generation and injection of signals exchanged over the various buses. Communication path 152 and 150 may be any of several well known to communication media and may use any protocols well known to those of ordinary skill in the art. For example, in one preferred embodiment, communication path 152 may be a simple RS-232 serial communication line where the interaction between host system 100 and the switching elements 122 through 128 includes a low volume of information. In the alternative where a higher bandwidth communication is required for transferring larger volumes of data, communication path 152 may be a network communication path providing higher speed and higher reliability. In like manner, communication path 150 between host system 100 and system under test 110 may be any well known or custom communication path appropriate to the standard operation of system under test 110 by host system 100.

FIG. 2 is a flowchart describing operation of an automated test process utilizing the enhanced features of the present intention to enable automated test processing to include real-world stimulus test procedures. Those skilled in the art will recognize that a test process may be performed requiring manual intervention for generating real-world stimuli as presently practiced in the art or may be performed in a totally automated process in accordance with the present invention. In addition, the present invention permits a hybrid approach incorporating both manual processes and fully automated processes to generate real-world stimuli to be applied to a system under test. In essence, a method of the present invention tests whether a desired real-world stimulus is available for automated generation and application (i.e., is associated with a corresponding logic level driver or power relay driver element). If so, the stimulus is provided by automated means and processes in accordance with the invention. If the requested stimulus is not associated with a corresponding driver element, then manual intervention is required and solicited to generate and apply the real-world stimulus to the system under test. Those skilled in the art will recognize that the invention pertains to provision of such automated test procedures as well as automated procedures combined with such known manual procedures where automated processes are not available.

Element 200 is first operable to initiate the automated test process. Standard automated test processing including script interpretation and execution continues until element 202 detects a requirement for generation of a real-world, environmental stimulus as specified in the automated test process. When such a real-world stimulus request is detected by operation of element 202 (i.e., by processing of a script directive), element 204 next determines whether the requested stimulus is for simulation of a logic level signal. If so, element 206 is next operable to determine whether an appropriate logic level driver switching element is configured for use in simulating the desired real-world stimulus— in other words determining whether the requested signal path is coupled to a logic level driver in the system. If so, element 208 provides the desired automated logic level stimulus by appropriate control of the associated logic level driver. Automated test processing then continues by looping back to element 202 to await a next requirement for a real-world stimulus.

Where element 204 determines that the requested real-world stimulus is for other than a logic level signal, processing continues at element 210 presuming that the requested real-world stimulus is for simulation of a power related signal. Element 210 therefore determines whether a power relay driver switching element is associated with the signal to be simulated. If so, processing continues with element 212 to provide the requested power signal stimulus simulation. Processing then continues with further automated testing simulation by looping back to element 202 to await a next request for a real-world environmental stimulus.

If either element 206 or element 210 determines that no appropriate driver switching element is associated with the requested real-world stimulus signal, processing continues at element 214 to resort to well known manual processing techniques. Specifically, element 214 prompts a human operator to provide the appropriate requested real-world stimulus. Element 216 then awaits an indication from the human user that the requested real-world environmental stimulus has been supplied. Processing then continues by looping back to element 202 to await a next request for real-world, environmental stimulus. Elements 214 and 216 therefore provide a mechanism for standard manual processing of the requested real-world stimulus where the enhanced features of the present intention are not available or not configured for use to simulate the requested signal.

Those of ordinary skill in the art will readily recognize that in one exemplary application of the features of the present intention, logic signals relating to interaction between a storage controller and storage devices within a storage subsystem may be intercepted and simulated by appropriately configured logic level driver switching elements under control of the process of FIG. 2. For example, simulation of removal or insertion of a disk drive in a storage subsystem under test may be simulated by generation and application (injection) of appropriate signals indicating the presence or absence of a particular disk drive in the subsystem. In like manner, application or removal of power to components of the storage subsystem may be simulated by control of appropriately configured power relay driver switching elements in accordance with the method of FIG. 2. For example, loss of power to a storage controller within a storage subsystem may be simulated by generation and application (injection) of appropriate signals within a power relay driver switching element.

Still further, those of ordinary skill in the art will recognize that the overall sequence and operation of test process depicted in FIG. 2 is merely intended as exemplary of one possible design. Those of ordinary skill in art will readily recognize numerous equivalent sequences and structures for performing automated test sequences on electronic systems under test.

While the invention has been illustrated and described in the drawings and foregoing description, such illustration and description is to be considered as exemplary and not restrictive in character, it being understood that only the preferred embodiment and minor variants thereof have been shown and described and that all changes and modifications that come within the spirit of the invention are desired to be protected.

What is claimed is:

1. Apparatus for enhanced automated testing of a system under test, the system under test comprising a storage subsystem including storage controller, a storage device and an one or more internal bus structures, said apparatus comprising:

an automated test system for applying stimuli to said system under test and for verifying proper operation of said system under test in response to said stimuli;

a switching device coupled to the one or more internal bus structures for controllably applying stimuli to said system under test to simulate insertion and removal of the storage device in the storage subsystem; and a communication medium coupling said automated test system to said switching device to enable control of said switching device by said automated test system, wherein the automated test system is operable to verify proper operation of the storage subsystem in response to the simulated insertion and removal of a storage device.

2. The apparatus of claim 1 wherein said switching device comprises:
   a logic level switching device to switch logic signals within said system under test as said stimuli thereto, wherein the logic signals are switched to simulate the insertion or removal of a storage device in the storage subsystem.

3. The apparatus of claim 1 wherein the storage subsystem further includes at least one power supply device and wherein said switching device comprises:
   a power relay switching device to switch power signals within said system under test as said stimuli thereto, wherein the power signals are switched to simulate the insertion or removal of a storage device in the storage subsystem.

4. The apparatus of claim 1 wherein said communication medium is a serial interface.

5. The apparatus of claim 1 wherein said communication medium is a network communication medium.

6. The apparatus of claim 1 wherein said switching device comprises:
   a first logic level driver device coupled to an internal bus structure associated with said storage controller; and
   a second logic level driver device coupled to an internal bus structure associated with said storage device,
   wherein the first logic level driver device and the second logic level driver device are operable to simulate signals exchanged between the storage controller and the storage device.

7. The apparatus of claim 6 wherein said first and second logic level driver devices are associated with internal bus structures that include:
   a storage device present signal path used in stimulating removal and insertion of said storage unit.

8. The apparatus of claim 1 wherein said storage subsystem further includes a power supply device and wherein said switching device comprises:
   a power relay driver device coupled to an internal bus structure associated with the power supply device, the power relay driver device used to simulate power signals exchanged between the power supply device and either of the storage controller and the storage device.

9. The apparatus of claim 8 wherein said power relay driver device is associated with an internal bus structure that includes:
   a power signal path used in simulating removal and application of power signals from said power supply device to said storage controller or to said storage device.

10. The apparatus of claim 9 wherein said power supply device is a battery power supply device.

11. A system comprising:
    a switching device having one or more signal driver devices for receiving signals and for simulating signals;
    an automated test system coupled to the switching device for controllably generating sequences of tests involving the received signals and the simulated signals to test a system under test; and
    a system under test coupled to the switching device, the system under test comprising a storage subsystem including a storage controller and including a storage device and including internal bus structures associated with the storage controller and with the storage device, the internal bus structures coupled to the switching device,
    wherein the automated test system is adapted to simulate removal and insertion of a storage device in the system under test by simulated signals applied to the system under test through the switching device and wherein the automated test system is further adapted to verify proper operation of the storage controller in response to the simulated removal and insertion of the storage device by sensing received signals from the storage controller through the switching device.

12. The system of claim 11 wherein the switching device includes:
    logic level driver devices to simulate and receive logic signals on the internal bus structures.

13. The system of claim 12 wherein the logic signals include a storage device present signal.

14. The system of claim 11 wherein the storage subsystem further includes a power supply.

15. The system of claim 14 wherein the switching device includes:
    power driver devices to simulate application of power signals to the internal bus structures.

16. A method for testing a storage subsystem including a storage controller and including a storage device and including internal bus structures associated with the storage controller and with the storage device, the method comprising the steps of:
    generating, within an automated test system external to the storage subsystem, simulated signals normally exchanged between the storage device and the storage controller;
    intercepting, within the automated test system, signals normally exchanged between the storage device and the storage controller;
    simulating removal and insertion of the storage device in the storage subsystem by applying the simulated signals to the internal bus structures; and testing proper operation of the storage subsystem by verifying the intercepted signals.

17. The method of claim 16 wherein the simulated signals include a storage device present signal and wherein the step of simulating includes simulating transitions of the storage device present signal and wherein the step of testing includes verifying proper operation of the storage controller in response to transitions of the storage device present signal.

18. The method of claim 16 wherein the storage subsystem further includes a power supply coupled to an internal bus structure for applying a power signal thereto intended for application the storage controller or to the storage device and wherein the step of simulating includes simulating transitions of the power signal and wherein the step of testing includes verifying proper operation of the storage controller or the storage device in response to transition of the power signal.

* * * * *